US010140394B2

United States Patent
Kommisetti et al.

(10) Patent No.: US 10,140,394 B2
(45) Date of Patent: Nov. 27, 2018

(54) METHOD FOR REJECTING TUNING DISTURBANCES TO IMPROVE LAMP FAILURE PREDICTION QUALITY IN THERMAL PROCESSES

(71) Applicant: Applied Materials, Inc., Santa Clara, CA (US)

(72) Inventors: Subrahmanyam Venkata Rama Kommisetti, Singapore (SG); Haw Jyue Luo, Hsinchu (TW); Jimmy Iskandar, Fremont, CA (US); Hsincheng Lai, Tainan (TW); Parris Hawkins, Los Altos, CA (US)

(73) Assignee: Applied Materials, Inc., Santa Clara, CA (US)

(*) Notice: Subject to any disclaimer, the term of this patent is extended or adjusted under 35 U.S.C. 154(b) by 430 days.

(21) Appl. No.: 14/841,365

(22) Filed: Aug. 31, 2015

(65) Prior Publication Data

US 2016/0092618 A1 Mar. 31, 2016

Related U.S. Application Data

(60) Provisional application No. 62/055,481, filed on Sep. 25, 2014.

(51) Int. Cl.
*G06F 17/50* (2006.01)
*H05B 37/03* (2006.01)
(Continued)

(52) U.S. Cl.
CPC .......... *G06F 17/5009* (2013.01); *G06F 7/556* (2013.01); *H05B 37/03* (2013.01);
(Continued)

(58) Field of Classification Search
CPC ............... G05B 2219/37537; G05B 23/0221
See application file for complete search history.

(56) References Cited

U.S. PATENT DOCUMENTS

| 6,448,716 | B1* | 9/2002 | Hutchison | .......... H05B 33/0803 |
| | | | | 315/129 |
| 2003/0029859 | A1* | 2/2003 | Knoot | ............... H01L 21/67248 |
| | | | | 219/483 |

(Continued)

FOREIGN PATENT DOCUMENTS

EP  1458222 A1  9/2004

OTHER PUBLICATIONS

MacIsaac, et al. "Basic Physics of the Incandescent Lamp (Lightbulb)." The Physics Teacher, vol. 37 (1999) [retrieved on Nov. 7, 2017]. Retrieved from <http://my.ece.ucsb.edu/York/Bobsclass/134/Handouts/Phys%20Teach%20vol37%20Dec1999.pdf> (Year: 1999).*

(Continued)

*Primary Examiner* — Aniss Chad
*Assistant Examiner* — Alfred H B Wechselberger
(74) *Attorney, Agent, or Firm* — Patterson + Sheridan, LLP

(57) ABSTRACT

Embodiments disclosed herein include methods for reducing or eliminating the impact of tuning disturbances during prediction of lamp failure. In one embodiment, the method comprises monitoring data of a lamp module for a process chamber using one or more physical sensors disposed at different locations within the lamp module, creating virtual sensors based on monitoring data of the lamp module, and providing a prediction model for the lamp module using the virtual sensors as inputs.

9 Claims, 8 Drawing Sheets

(51) Int. Cl.
 *G06F 7/556* (2006.01)
 *G05B 23/02* (2006.01)
(52) U.S. Cl.
 CPC ........ *G05B 23/024* (2013.01); *G05B 23/0221* (2013.01); *G05B 2219/37537* (2013.01); *G06F 2207/556* (2013.01)

(56) References Cited

U.S. PATENT DOCUMENTS

| | | |
|---|---|---|
| 2008/0164822 A1 | 7/2008 | Serebryanov et al. |
| 2009/0039070 A1 | 2/2009 | Tseng et al. |
| 2010/0052542 A1 | 3/2010 | Siemiet et al. |
| 2010/0165338 A1 | 7/2010 | Claps |
| 2013/0002140 A1 | 1/2013 | Serebryanov et al. |
| 2013/0207544 A1* | 8/2013 | Kaskey .................. H05B 37/03 315/89 |
| 2013/0268469 A1 | 10/2013 | Sharma et al. |

OTHER PUBLICATIONS

Su et al. "Intelligent Prognostics System Design and Implementation." IEEE Transactions on Semiconductor Manufacturing, vol. 19, No. 2 (2006) [retrieved on Nov. 6, 2017]. Retrieved from <http://ieeexplore.ieee.org/document/1628982/> (Year: 2006).*
International Search Report and Written Opinion for International Application No. PCT/US2015/048481 dated Nov. 30, 2015.

* cited by examiner

METHOD FOR REJECTING TUNING DISTURBANCES TO IMPROVE LAMP FAILURE PREDICTION QUALITY IN THERMAL PROCESSES

CROSS-REFERENCE TO RELATED APPLICATIONS

This application claims benefit of U.S. provisional patent application Ser. No. 62/055,481, filed Sep. 25, 2014, which is herein incorporated by reference.

BACKGROUND

Field

Embodiments of the present disclosure generally relate to apparatus and methods for predicting lamp failure in a thermal processing chamber.

Description of the Related Art

With the on-going pressures of lowering cost, improving quality and reducing variability in the face of larger wafer and smaller feature sizes, the nano-manufacturing industry has begun to embrace a move to augmenting reactive operation with prediction. Predictive capabilities such as predictive maintenance (PdM) are cited by the ITRS as critical technologies to incorporate into production over the next five years, with PdM identified as a key component to reduce unscheduled downtime, maintain high quality, and reduce cost.

Many thermal process chambers use lamps to perform various processes such as film deposition, annealing, dopant activation, rapid thermal oxidation, or silicidation etc. Lamp failure is a critical downtime event type in thermal processes, and can result in costly downtime, loss of yield and possibly wafer scrap. Predicting lamp failure results in a lowering of the associated unscheduled downtime and/or extending uptime.

As lamps change properties over time, including degrading, there is a need to maintain consistent and correct temperature profiles in the process chamber so that acceptable yields are maintained right up until the point at which the equipment is brought down and the lamp is replaced. This is achieved by making "tunings" which adjustments to the equipment settings such as power levels to the lamps and gas flows. These adjustments and adjustment magnitudes are not always recorded or accessible by PdM models. However, these adjustments provide a significant source of noise to the prediction models, lowering their effectiveness (e.g., by increasing false positive or reducing true positive prediction levels).

Accordingly, there is a need for improved methods to reduce the impact of tuning disturbances so that prediction of lamp failure can be performed effectively.

SUMMARY

Embodiments disclosed herein include methods for reducing the impact of tuning disturbances during prediction of lamp failure. In one embodiment, the method comprises creating virtual sensors by monitoring and collecting data comprising current and resistance related to an upper lamp and a lower lamp of a lamp module for a process chamber, wherein the virtual sensors are represented as equations selected from one or more of the following:

$$TIIR = \log\left(abs\left(\frac{TII}{k1*TIR}\right)+1\right), \quad (1)$$

$$TOIR = \log\left(abs\left(\frac{TOI}{k2*TOR}\right)+1\right), \quad (2)$$

$$BIIR = \log\left(abs\left(\frac{BII}{k3*BIR}\right)+1\right), \quad (3)$$

$$BOIR = \log\left(abs\left(\frac{BOI}{k4*BOR}\right)+1\right), \text{ and} \quad (4)$$

$$TIR = \log\left(abs\left(\frac{TII}{k1*TIR} + \frac{TOI}{k2*TOR} + \frac{BII}{k3*BIR} + \frac{BOI}{k4*BOR}\right)+1\right), \quad (5)$$

wherein TII is "Top Inner Current," BII is "Bottom Inner Current," TOI is "Top Outer Current," BOI is "Bottom Outer Current," TIR is "Top Inner Resistance," BIR is "Bottom Inner Resistance," TOR is "Top Outer Resistance," BOR is "Bottom Outer Resistance," and the expression "log" in equations is natural logarithm, and where factors k1, k2, k3, k4 are constants extracted from the data, and providing a lamp failure prediction for the lamp module using the virtual sensors as inputs.

In another embodiment, the method comprises monitoring data of a lamp module for a process chamber using one or more physical sensors disposed at different locations within the lamp module, creating virtual sensors based on monitoring data of the lamp module, and providing a prediction model for the lamp module using the virtual sensors as inputs.

In yet another embodiment, the method comprises identifying components of a principal factor within a first scatter plot presented in a two-axis coordinate system showing a trend line of a first variable and a second variable plotted against each other, wherein the trend line has one or more discrete value changes, and the first and second variables are associated with one or more physical sensors disposed at different locations within a lamp module for a process chamber, identifying a main direction of a cloud of plotted points within the first scatter plot having the largest variance, rotating the scatter plot until no discrete value changes in the trend line can be seen when viewing from one axis of the coordinate system to obtain at least one or more rotated vector equations, wherein the one or more rotated vector equations are a function of the first and second variables, and establishing a predictive maintenance (PdM) model for the lamp module using a specific rotated vector equation containing information of pure nature lamp decay.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments disclosed herein include methods for reducing or eliminating the impact of tuning disturbances during prediction of lamp failure. In one embodiment, one or more virtual sensors, which are mathematical combinations of physical sensors that are measurable, are used to monitor current drawn at a given resistance of a lamp module, and provide inputs to prediction models for lamp health. In another embodiment, a pair-wise technique using mathematics is adapted to extract information of pure nature lamp decay while eliminating power ratio tuning effect that would cause PdM curve unstable. Embodiments and the concept of the present disclosure can be applied to any thermal process chamber that uses heating lamps to generate the heat. Embodiments of the devices and systems are more clearly described with reference to the figures below.

Exemplary Chamber Hardware

Figure 1:
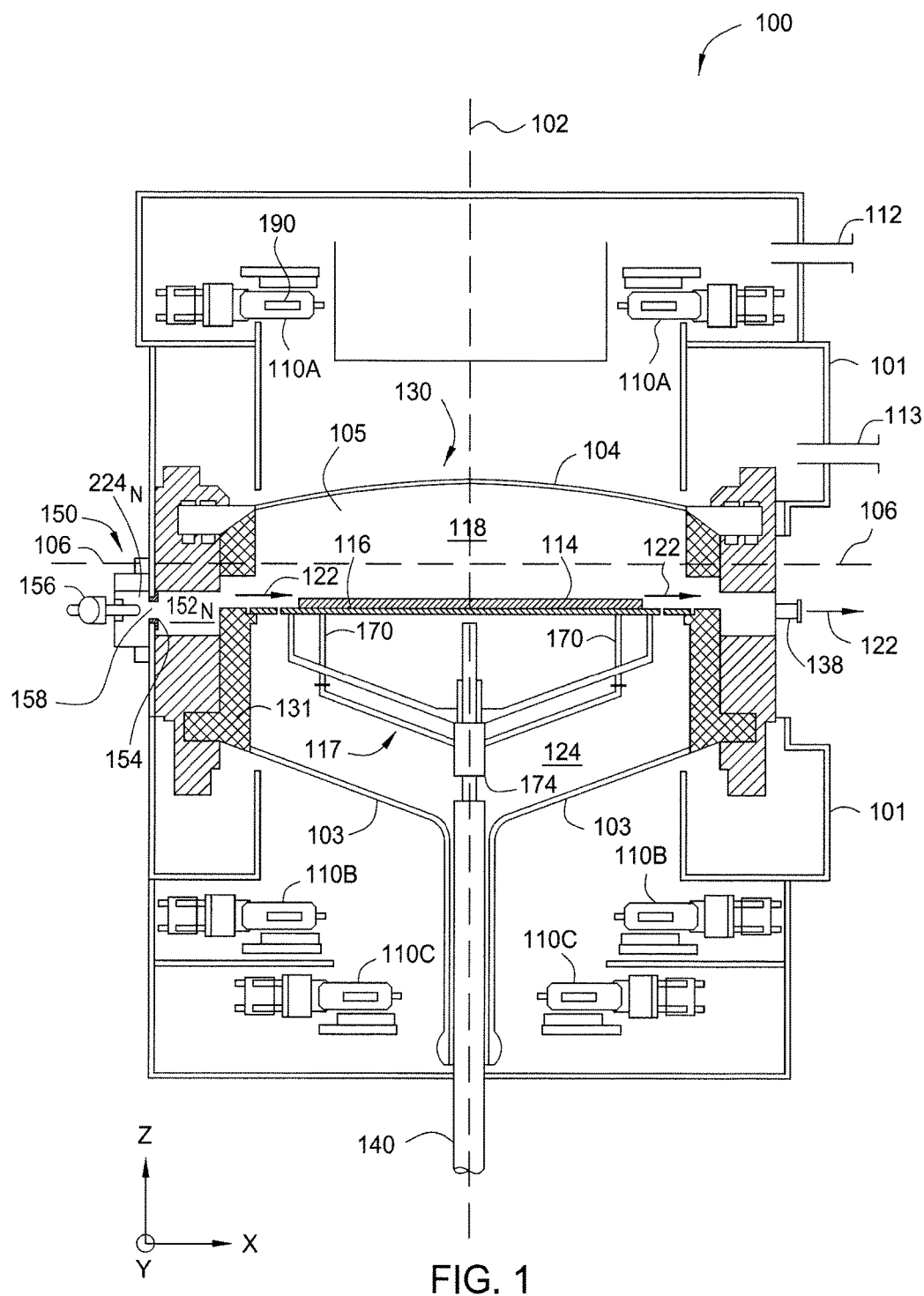
FIG. 1 is a schematic cross-sectional view of an exemplary process chamber configured for epitaxial deposition.

FIG. 1 is a schematic cross-sectional view of a process chamber 100 configured for epitaxial deposition, which may be part of a CENTURA® integrated processing system available from Applied Materials, Inc., of Santa Clara, Calif. It is contemplated that the process chamber for epitaxial process is described as an example since the concept of the present disclosure is also applicable to other thermal process chambers that is capable of providing a controlled thermal cycle that heats the substrate for processes such as, for example, thermal annealing, thermal cleaning, thermal chemical vapor deposition, thermal oxidation and thermal nitridation, regardless of whether the heating elements are provided at the top, bottom, or both of the process chamber.

The process chamber 100 includes housing structure 101 made of a process resistant material, such as aluminum or stainless steel, for example 316L stainless steel. The housing structure 101 encloses various functioning elements of the process chamber 100, such as a quartz chamber 130, which includes an upper chamber 105, and a lower chamber 124, in which a processing volume 118 is contained. Reactive species are provided to the quartz chamber 130 by a gas distribution assembly 150, and processing byproducts are removed from processing volume 118 by an outlet 138, which is typically in communication with a vacuum source (not shown).

A substrate support 117 is adapted to receive a substrate 114 that is transferred to the processing volume 118 on a surface 116 of the substrate support 117. The substrate support 117 may be made of a ceramic material or a graphite material coated with a silicon material, such as silicon carbide, or other process resistant material. Reactive species from precursor reactant materials are applied to the exposed surface of the substrate 114, and byproducts may be subsequently removed from the surface of the substrate 114. Heating of the substrate 114 and/or the processing volume 118 may be provided by radiation sources, such as upper lamp modules 110A and lower lamp modules 110B. In one embodiment, the lower lamp modules include bottom outer lamp modules 110B and bottom inner lamp modules 110C. The substrate support 117 may rotate about a central axis 102 of the substrate support while moving in a direction parallel to the central axis 102 by displacement of support shaft 140. Lift pins 170 are provided that penetrate the surface 116 of the substrate support 117 and lift the substrate 114 above the substrate support 117 for transportation into and out of the processing chamber. The lift pins 170 are coupled to the support shaft 140 by a lift pin collar 174.

In one embodiment, the upper lamp modules 110A and lower lamp modules 110B are infrared (IR) lamps. The upper lamp modules 110A and lower lamp modules 110B may have a filament 190, which produces energy or radiation. The energy or radiation from upper lamp modules 110A travels through upper quartz window 104 of upper quartz chamber 105. Respectively, energy or radiation from lower lamp modules 110B travels through the lower quartz portion 103 of lower quartz chamber 124. Cooling gases for upper quartz chamber 105, if needed, enter through an inlet 112 and exit through an outlet 113. Precursor reactant materials, as well as diluent, purge and vent gases for the chamber 100, enter through gas distribution assembly 150 and exit through outlet 138.

The low wavelength radiation in the processing volume 118, which is used to energize reactive species and assist in adsorption of reactants and desorption of process byproducts from the surface 116 of substrate 114, typically ranges from about 0.8 $\mu$m to about 1.2 $\mu$m, for example, between about 0.95 $\mu$m to about 1.05 $\mu$m, with combinations of various wavelengths being provided, depending, for example, on the composition of the film which is being epitaxially grown. In another embodiment, the lamp modules 110A and 110B may be ultraviolet (UV) light sources. In one embodiment, the UV light source is an excimer lamp. In another embodiment, UV light sources may be used in combination with IR light sources in one or both of the upper quartz chamber 105 and lower quartz chamber 124.

The component gases enter the processing volume 118 via gas distribution assembly 150 through port 158, which may have a portal liner 154, and through passage 152N. The portal liner 154 may be a nozzle in some embodiments. The gas distribution assembly 150 includes a tubular heating element 156, disposed in a conduit 224N, that heats the processes gases to a pre-determined temperature before they enter the processing chamber. Gas flows from the gas distribution assembly 150 and exits through port 138 as shown generally at 122. Combinations of component gases, which are used to clean/passivate a substrate surface, or to form the silicon and/or germanium-containing film that is being epitaxially grown, are typically mixed prior to entry into the processing volume. The overall pressure in the processing volume 118 may be adjusted by a valve (not shown) on the outlet port 138. At least a portion of the interior surface of the processing volume 118 is covered by a liner 131. In one embodiment, the liner 131 comprises a quartz material that is opaque. In this manner, the chamber wall is insulated from the heat in the processing volume 118.

The temperature of surfaces in the processing volume 118 may be controlled within a temperature range of about 200° C. to about 600° C., or greater, by the flow of a cooling gas, which enters through a port 112 and exits through port 113, in combination with radiation from upper lamp modules 110A positioned above upper quartz window 104. The temperature in the lower quartz chamber 124 may be controlled within a temperature range of about 200° C. to about 600° C. or greater, by adjusting the speed of a blower unit which is not shown, and by radiation from the lower lamp modules 110B disposed below lower quartz chamber 124. The pressure in the processing volume 118 may be between about 0.1 Torr to about 600 Torr, such as between about 5 Torr to about 30 Torr.

The temperature on a surface of the substrate 114 may be controlled by power adjustment to the lower lamp modules 110B in lower quartz chamber 124, or by power adjustment to both the upper lamp modules 110A overlying upper quartz chamber 105, and the lower lamp modules 110B in lower quartz chamber 124. The power density in the processing volume 118 may be between about 40 W/cm$^2$ to about 400 W/cm$^2$, such as about 80 W/cm$^2$ to about 120 W/cm$^2$.

In one aspect, the gas distribution assembly 150 is disposed normal to, or in a radial direction 106 relative to, the longitudinal axis 102 of the chamber 100 or substrate 114. In this orientation, the gas distribution assembly 150 is adapted to flow process gases in a radial direction 106 across, or parallel to, a surface of the substrate 114. In one application, the process gases are preheated at the point of introduction to the chamber 100 to initiate preheating of the gases prior to introduction to the processing volume 118, and/or to break specific bonds in the gases. In this manner, surface reaction kinetics may be modified independently from the thermal temperature of the substrate 114.

Lamp Failure Prediction

The term "lamp failure" may refer to a short circuit between adjacent turns of the filament used in a lamp, a short circuit between a helical filament and a support pillar, or sagging of the filament toward a substrate disposed within the process chamber (which negatively affects the amount of radiation delivered to the substrate) after a certain number of processing cycles, etc. In current industrial process, when the required temperature profile on a substrate is deviating, one or more following procedures may be performed: (1) adjusting the power ratios to help maintain or achieve the desired temperature distribution across the surface of the substrate; (2) in case the power ratio could not support or resolve the issue, adjusting the physical location of the lamp or tilting the angle of the lamp to help maintain or achieve the desired temperature distribution across the surface of the substrate; and (3) replacing the lamps if the above approaches do not result in an acceptable heating profile on the substrate.

Typically, advanced statistical methods are used for building high fidelity (high quality) prediction models of performance indicators, for example, for virtual metrology (VM), yield, defects, and predictive maintenance (PdM). PdM procedure may include one or more following steps: (1) data aggregation, which merges multiple data sources; (2) data treatment, which determines correct data treatment by merging recipes and/or normalizing data; (3) feature selection, which selects critical sensor statistics for model building; (4) model building, which builds model based on training data of critical independent variables and therefore provides predictive algorithms; (5) model analysis, which determines prediction accuracy (e.g., true positive, false positive, or false negative); and (6) cost benefit analysis, which determines annual cost and benefit based on the model analysis.

While PdM can be used for monitoring lamp health, developing high fidelity prediction models is challenging because of noise in current and resistance in a lamp module due to tuning by process engineers. For example, the lamp may experience a sudden increase or decrease of current and/or resistance due to power ratio tuning correlated to input and/or process data, which makes it difficult to accurately identify the cause of failure in data. These noises will have a negative impact on PdM, causing the prediction results to fluctuate. Developing a robust PdM model requires noise reduction or elimination from input signals.

In addition, heating of the substrate 114 and/or the processing volume 118 may be provided by radiation sources, such as upper lamp modules 110A and lower lamp modules 110B, as discussed previously in FIG. 1. In some thermal processes, one or more lamp modules may be used to control the temperature profile distribution across the surface of the substrate. Each lamp modules may consist of various numbers of lamps, in multiples of four. In one embodiment, four lamps may be arranged in parallel to form a sub-lamp module, and sub-lamp modules are connected in series. To maintain the profile of temperature across the substrate, power ratios of the various lamp modules may be adjusted. However, these adjustments cause disturbances in the univariate (UVA) signals that are used in predictive maintenance (PdM) models, making it difficult to use these signals effectively. For example, a change in power may cause a corresponding change in current that is going through the filament of the lamp. As lamp gets heated due to its resistance and heat is generated into the process. Heat generated by four lamp modules is adjusted according to desired temperature profile that is previously determined. While changing the power ratio, there will be change in current as well as resistance of the lamp modules. Therefore, it is very difficult to monitor the current and resistance alone as those are affected by power ratio tunings. In addition, as lamp ages, depending on the intensity of usage of lamps at four modules, degradation of the lamp begins. When this happens the substrate does not receive the same amount of heat from the same lamp even if the same power is applied. The same heat levels cannot be accomplished by simply increasing or decreasing the power of the lamp since tuning of power ratios between modules is also needed to achieve a desired temperature profile on the surface of the substrate.

To address the problems discussed above, the inventors of the present disclosure have proposed various approaches to reduce the impact of power ratio tuning disturbances, thereby improving feature selection on the PdM procedure. In one embodiment, a virtual sensor approach is adapted to improve feature selection on the PdM procedure. When monitoring current and resistance separately, disturbance to both current and resistance related features have been observed. Variation of both makes the PdM chart fluctuating and hard to track the lamp health. It is also difficult to decouple and/or reject the tuning effect on selected features. Therefore, in some aspects, one or more features may be selected and developed to eliminate the impact of power ratio tunings on prediction models.

For a process chamber using upper and lower lamp modules, selected features may include one or more of the following: (1) top inner current; (2) bottom inner current; (3) top outer current; (4) bottom outer current; (5) top inner resistance; (6) bottom inner resistance; (7) top outer resistance; and (8) bottom outer resistance. Selected features may be physically (directly) or not physically (indirectly) associated with one or more physical sensors disposed at different locations within a lamp module. Selected features may be identified through experiments to generate a number of virtual sensors, which can be mathematical combinations of physical sensors that are measurable. For example, a modeler may monitor and collect data of a lamp module using any one or more of the selected features (plus any additional custom features desired by the operator) associated with one or more physical sensors of the lamp module to create virtual sensors. In some embodiments, the data may include, but are not limited to current and resistance related to an upper lamp module and/or a lower lamp module. The data is summarized into a series of metrics, and then a PdM software may be used to analysis correlations between the summary metrics and the system maintenance log. These virtual sensors can be used as inputs to prediction models.

In one embodiment, five virtual sensors are created based on the selected features described above, and each of the virtual sensors can be represented as an equation as follows:

$$TIIR = \log\left(abs\left(\frac{TII}{k1*TIR}\right)+1\right), \quad (1)$$

$$TOIR = \log\left(abs\left(\frac{TOI}{k2*TOR}\right)+1\right), \quad (2)$$

$$BIIR = \log\left(abs\left(\frac{BII}{k3*BIR}\right)+1\right), \quad (3)$$

$$BOIR = \log\left(abs\left(\frac{BOI}{k4*BOR}\right)+1\right), \text{ and} \quad (4)$$

$$TIR = \log\left(abs\left(\frac{TII}{k1*TIR}+\frac{TOI}{k2*TOR}+\frac{BII}{k3*BIR}+\frac{BOI}{k4*BOR}\right)+1\right), \quad (5)$$

where TII is "Top Inner Current," BII is "Bottom Inner Current," TOI is "Top Outer Current," BOI is "Bottom Outer Current," TIR is "Top Inner Resistance," BIR is "Bottom Inner Resistance," TOR is "Top Outer Resistance," BOR is "Bottom Outer Resistance." The expression "log" in equations is natural logarithm. Factors k1, k2, k3, k4 are constants extracted from data.

Figure 2A:
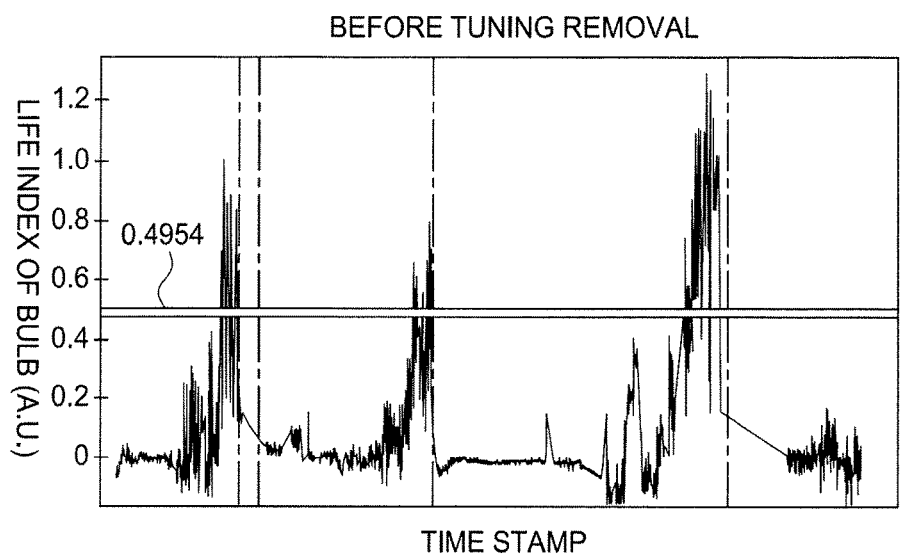
FIGS. 2A and 2B depict PdM modeling results before and after tuning removal according to embodiments of the present disclosure.
Figure 2B:
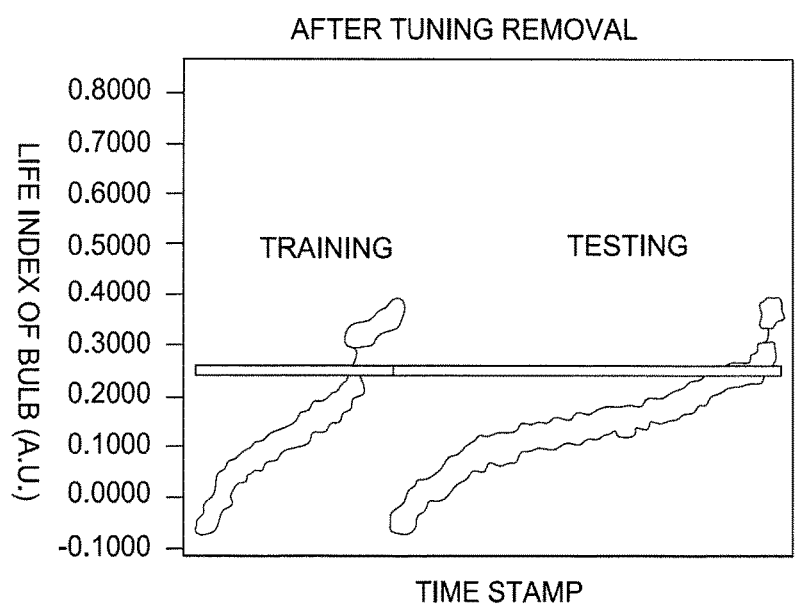

The concept of the above equations is, instead of monitoring power, current and resistance (of the lamp) separately, an operator can monitor current drawn for resistance, i.e., at a given resistance of a lamp module using the selected features listed above. This is because the current needs to be increased to maintain the heat generation (current is drawn to generate heat) as lamp ages. As lamp is aging, it will lose its resistance due to various reasons such as filament sagging and filament thinning etc. Monitoring the current drawn at a given resistance of a lamp module creates virtual sensors that can be used as inputs to prediction models. As a result, the negative impact of power ratio tuning disturbances on the predictive models can be alleviated. The use of virtual sensors provides more effective prediction models, especially during times of lamp degradation just before failure, when tuning is usually most aggressive. FIGS. 2A and 2B depict PdM modeling results before and after tuning removal, respectively, according to embodiments of the present disclosure.

Figure 3A:
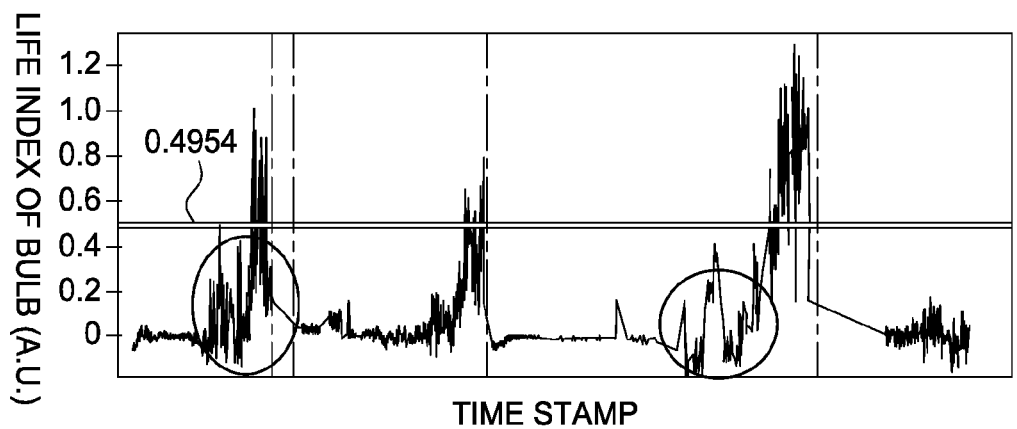
FIG. 3A is a diagram illustrating PdM curve is unstable due to power ratio tuning effect.
Figure 3B:
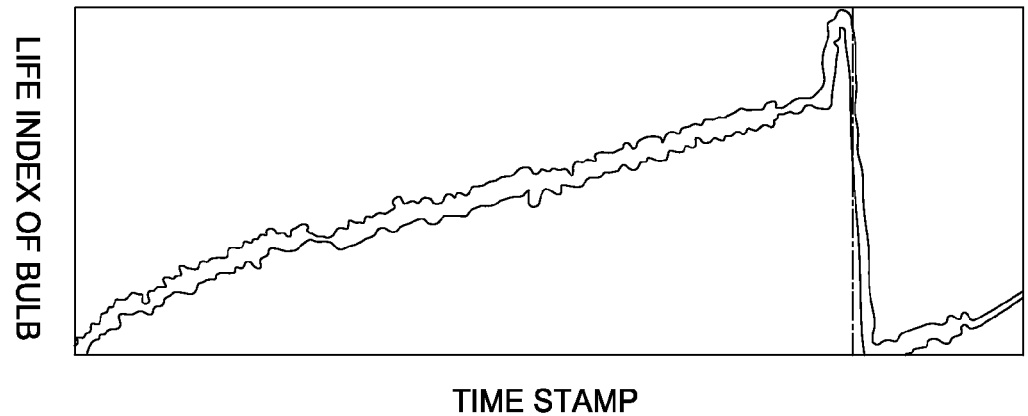
FIG. 3B is a diagram illustrating a PdM example after using PCA approach.

In another embodiment, a principal components analysis (PCA) approach is adapted to improve the PdM procedure. PCA is mathematically defined as a linear transformation that transforms the data to a new coordinate system such that the greatest variance by any projection of the data comes to lie on the first coordinate (called the first principal component), the second greatest variance on the second coordinate, and so on. To observe PdM model building results for lamp replacement, it has been observed by the present inventors that the power ratio tuning effect (including power, temperature, and gas) will seriously impact the PdM results and cause PdM curve unstable. FIG. 3A is a diagram illustrating PdM curve is unstable due to power ratio tuning effect. FIG. 3B is a diagram illustrating a PdM example after using PCA approach. The description below will discuss how a PCA approach is used to eliminate tuning effect and extract real lamp decayed information to obtain a smooth PdM curve.

Figure 4A:
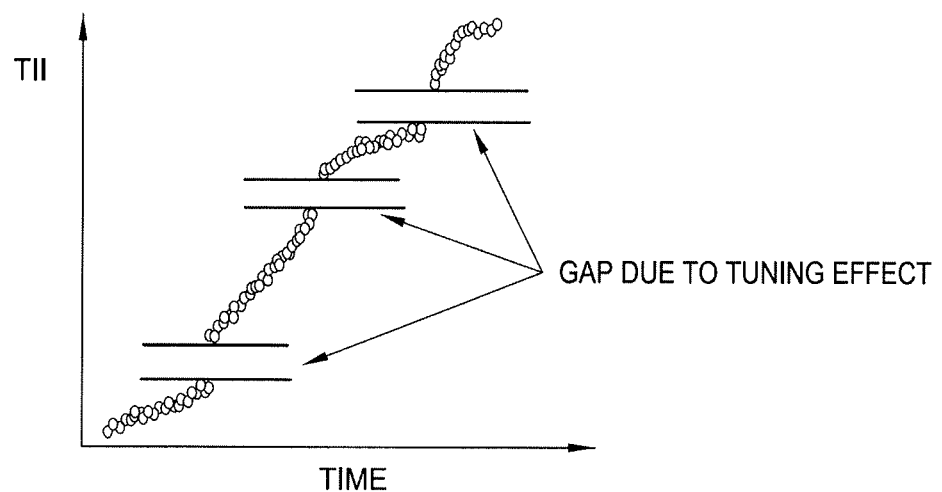
FIG. 4A is a diagram illustrating a trend plot showing the trend of one variable plotted on the y-axis against another variable on the x-axis in accordance with embodiments of the present disclosure.

FIG. 4A is a diagram illustrating a trend plot showing the trend of one variable (e.g., a selected feature) plotted on the y-axis against another variable (e.g., process run) on the x-axis in accordance with embodiments of the present disclosure. The selected feature may be any features discussed above with respect to FIGS. 2A and 2B. In one embodiment illustrated in FIG. 4A, the selected feature is top inner current (TII). The TII trend plot shows discrete value changes (gaps) due to power ratio tuning effect. It is noted that power ratio tuning creates noise spikes in the multivariate prediction model. Investigation done by the present inventors reveals that these spikes are correlated to gaps in the value signature of specific sensors from run-to-run (i.e., stepped changes in value).

Figure 4B:
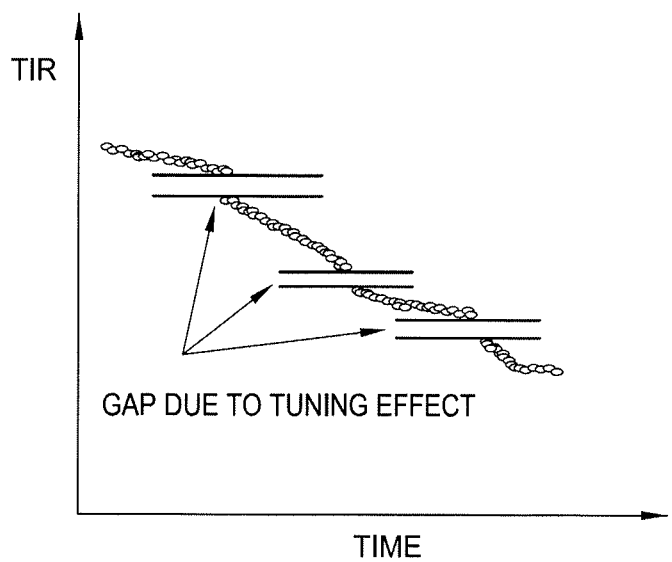
FIG. 4B is a diagram illustrating a trend plot showing the trend of one variable plotted on the y-axis against another variable on the x-axis in accordance with other embodiments of the present disclosure.

FIG. 4B is a diagram illustrating a trend plot showing the trend of one variable (e.g., a selected feature) plotted on the y-axis against another variable (e.g., process run) on the x-axis in accordance with embodiments of the present disclosure. Again, the selected feature may be any features discussed above with respect to FIGS. 2A and 2B. In one embodiment illustrated in FIG. 4B, the selected feature is top inner resistance (TIR). Similarly, the TIR trend plot shows discrete value changes (gaps) due to power ratio tuning effect.

Figure 4C:
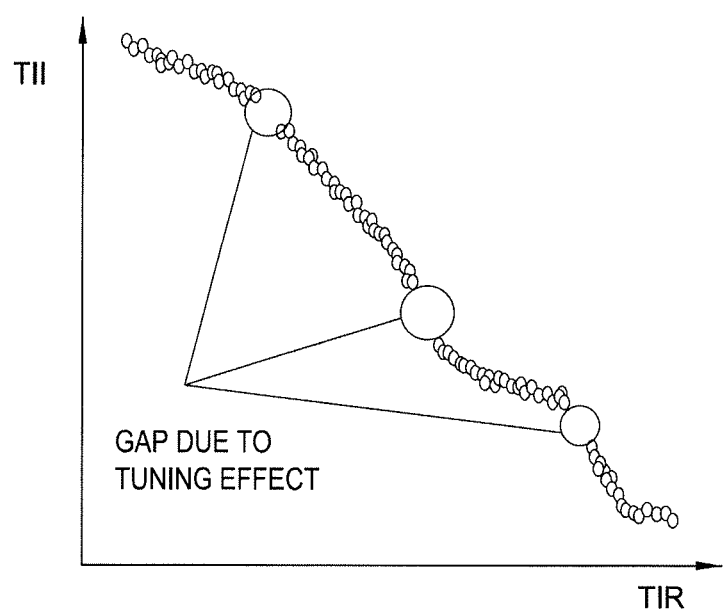
FIG. 4C is a diagram illustrating a scatter plot showing the trend of two variables plotted against each other in accordance with embodiments of the present disclosure.

FIG. 4C is a diagram illustrating a scatter plot presented in an orthogonal coordinate system (e.g., the x and y axes in a two-axis coordinate system) showing the trend of two variables (e.g., two different selected features) plotted against each other in accordance with embodiments of the present disclosure. The selected features may be any features discussed above with respect to FIGS. 2A and 2B. In one embodiment illustrated in FIG. 4C, the selected features are top inner current (TII) and top inner resistance (TIR). The scatter plot shows discrete value changes (gaps) due to power ratio tuning effect. The "trend down" in the scatter plot represents nature lamp decay information.

Figure 5:
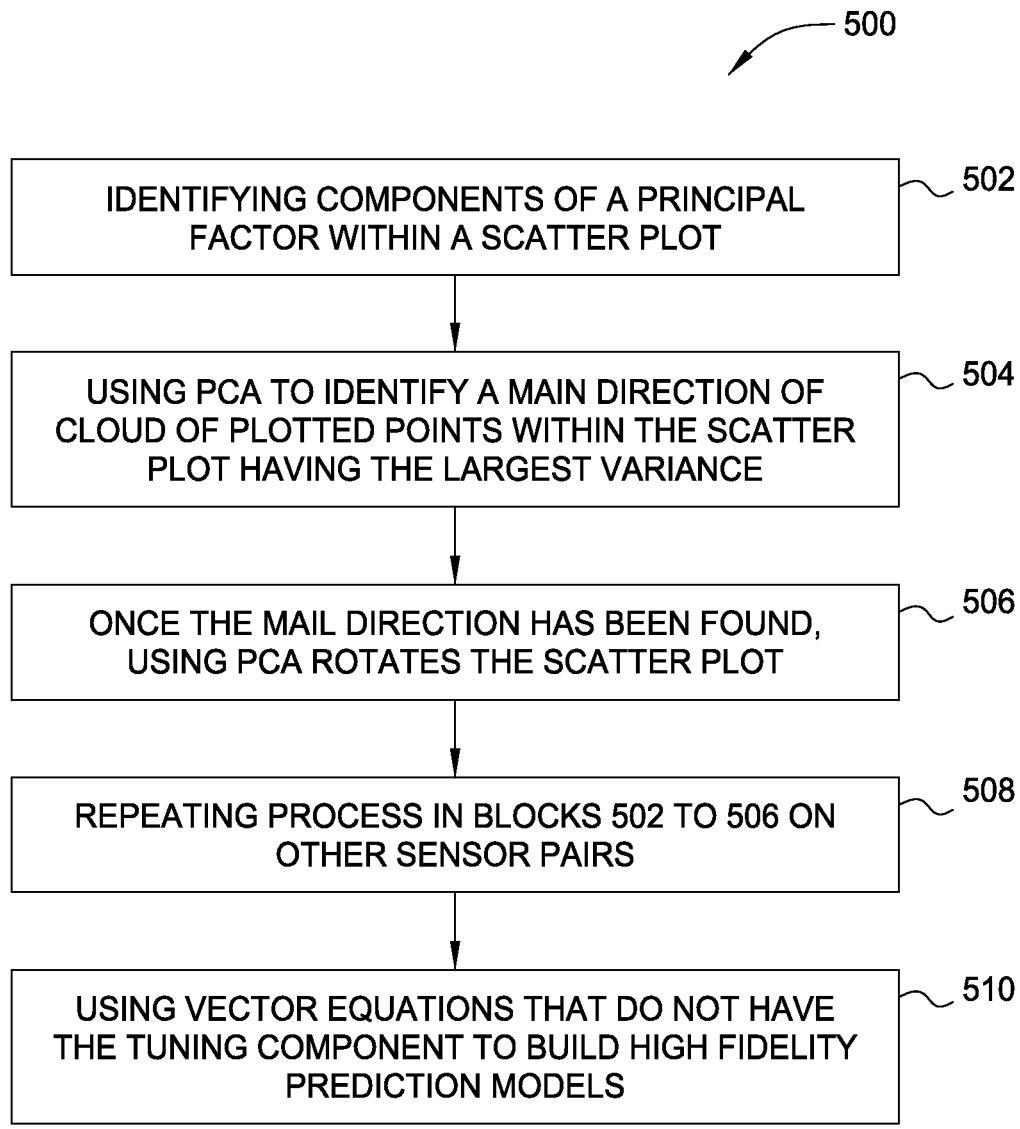
FIG. 5 is a flow diagram depicting a method for eliminating power ratio tuning effect according to embodiments of the present disclosure.

FIG. 5 is a flow diagram depicting a method 500 for eliminating power ratio tuning effect according to embodiments of the present disclosure. It should be noted that the sequence of steps illustrated in FIG. 5 are not intended to be limiting as to the scope of the disclosure described herein, since one or more steps may be added, deleted and/or reordered without deviating from the basic scope of the disclosure. The method 500 begins at block 502 by identifying components of a principal factor within a scatter plot. The components of the principal factor may be identified by centering the variables (e.g., two different selected features) and then plotting them against each other.

Figure 6A:
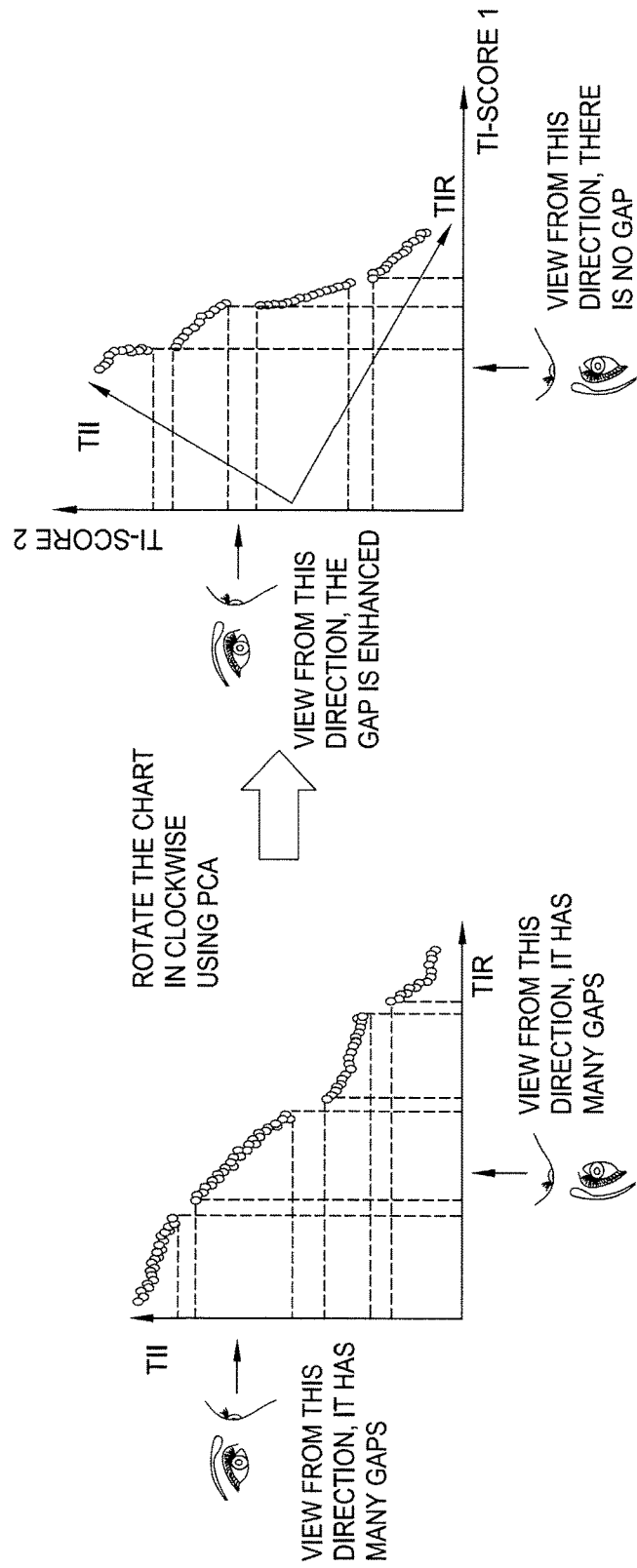
FIG. 6A is an exemplary scatter plot in which one variable is plotted on the y axis against another variable on the x axis according to embodiments of the present disclosure.

FIG. 6A is an exemplary scatter plot presented in an orthogonal coordinate system (e.g., the x and y axes in a two-axis coordinate system) in which one variable (e.g., TII) is plotted on the y axis against another variable (e.g., TIR) on the x axis according to embodiments of the present disclosure. More or less variables are contemplated. As can been seen in FIG. 6A, many discrete value changes (gaps) exist in the trend line of the scatter plot when viewing from x axis (TIR) and y axis (TII) of the scatter plot.

At block 504, PCA is used to identify a main direction of the cloud of plotted points such that it has the minimum of the sum of the squared distances from the plotted points to the main direction. That is, the plotted points along the main direction have the largest variance.

Figure 6B:
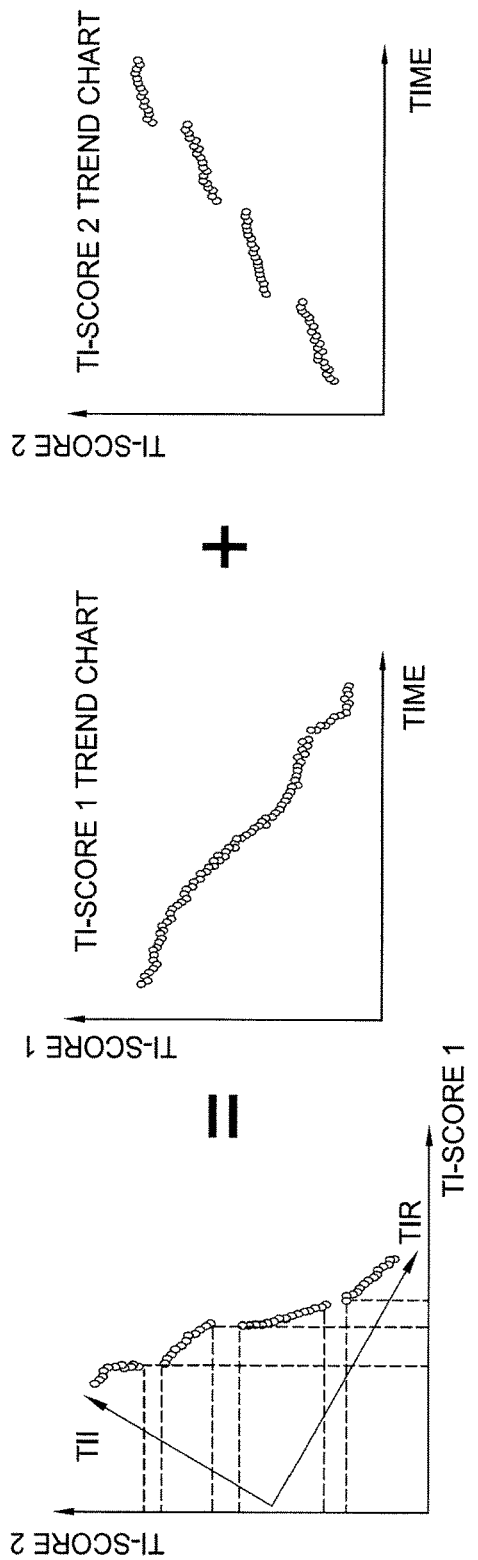
FIG. 6B is a new scatter plot established after rotation of the scatter plot in FIG. 6A.

At block 506, once the main direction has been found, PCA is used to rotate the scatter plot (in clockwise direction, for example) until the gaps are vertical jumps (or horizontal jumps). That is, the trend line is represented geometrically in a new two-axis coordinate system by the rotation of the original scatter plot of FIG. 6A. Although the "trend down" in the scatter plot remains unchanged, no discrete value changes (gaps) can be seen when viewing from the x axis of the new coordinate system, and the gaps are enhanced (i.e., become bigger) when viewing from the y axis of the new coordinate system, as shown in FIG. 6B. This new coordinate system assigns "TI-Score 1" to the horizontal (or x) axis, and "TI-Score 2" to the vertical (or y) axis. The TI-Score 1 and TI-Score 2 define rotated vector equations that are functions of TIR and TII. These rotated vector equations are therefore a function of the variables used in the original scatter plot and can be thought of as virtual sensors. TI-Score 1 in FIG. 6B is a trend chart of continuous data containing the information of pure "nature lamp decay" and TI-Score 2 is a trend chart of stepped data containing the information of "power ratio tuning effect" related to sudden increase or decrease of current and/or resistance in a lamp. With this rotation, the tuning component is eliminated from one vector and completely captured in a second vector. Therefore, the information of pure nature lamp decay can be separated from the information of tuning effect. This PCA approach extracts real lamp decayed information (i.e., TI-Score 1) which then can be used as an input set of PdM model building to provide a smooth PdM curve.

At block 508, processes described in blocks 502 to 506 can be repeated on other sensor pairs, such as top outer current (TOI) and top outer resistance (TOR), bottom inner current (BII) and bottom inner resistance (BIR), bottom outer current (BOI) and bottom outer resistance (BOR), as discussed previously. Again, the rotated vector equations can also be thought of as virtual sensors. TOI and TOR can be used to obtain TO-Score 1 and TO-Score 2, respectively, in a way as discussed in blocks 502 and 504. BII and BIR can be used to obtain BI-Score 1 and BI-Score 2, respectively, while BOI and BOR can be used to obtain BO-Score 1 and BO-Score 2, respectively. Similarly, certain sensors such as TO-Score 2, BI-Score 2, and BO-Score 2 are eliminated since they represent the information of tuning effect. As a result, the information of pure nature lamp decay can be separated from the information of tuning effect. This PCA approach extracts real lamp decayed information (i.e., TO-Score 1, BI-Score 1, and BO-Score 1), which again can be used as an input set of PdM model building to provide a smooth PdM curve. It is contemplated that other custom sensors desired by the operator may also be used in place of, or in addition to the sensors discussed herein.

At block 510, the vector equations that do not have the tuning component, such as TI-Score 1, TO-Score 1, BI-Score 1, and BO-Score 1, are used to build high fidelity prediction models. These prediction models are then used to provide a smooth, meaningful, and robust PdM curve that can be used to better predict lamp health, or improve lamp failure prediction quality in thermal processes. Accordingly, unscheduled downtime and cost are reduced, and high quality of substrate processing is achieved.

Embodiments of the present disclosure effectively identify the importance of feature inputs for predictive maintenance (PdM), demonstrate feature engineering, and construct new features from existing ones with the aim of achieving prediction stability by using virtual sensors as inputs to prediction models while alleviating the negative impact of power ratio tuning on prediction models, or by using mathematics to extract information of pure nature lamp decay while eliminating power ratio tuning effect that would cause PdM curve unstable. Embodiments of the present disclosure have been proved to be able to achieve at least 90% true positives of lamp failure prediction accuracy with no false positives. The prediction results are smooth due to elimination of the vector equations that do not have the tuning component. Therefore, the information of pure nature lamp decay can be separated from the information of tuning effect. Although the embodiments described herein are described with reference to the upper and lower lamp modules, it is understood that these embodiments are equally applicable to other lamps which may be used within or adjacent to a processing chamber. The aforementioned advantages are illustrative and not limiting.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:
1. A method for lamp failure prediction, comprising:
creating virtual sensors by collecting data comprising current and resistance related to an upper lamp and a lower lamp of a lamp module disposed in a semiconductor process chamber, wherein the virtual sensors are represented as equations selected from one or more of the following:

$$\text{first virtual sensor} = \log\left(\text{abs}\left(\frac{TII}{k1*TIR}\right)+1\right),$$

$$\text{second virtual sensor} = \log\left(\text{abs}\left(\frac{TOI}{k2*TOR}\right)+1\right),$$

$$\text{third virtual sensor} = \log\left(\text{abs}\left(\frac{BII}{k3*BIR}\right)+1\right),$$

$$\text{fourth virtual sensor} = \log\left(\text{abs}\left(\frac{BOI}{k4*BOR}\right)+1\right), \text{ and}$$

fifth virtual sensor =

$$\log\left(\text{abs}\left(\frac{TII}{k1*TIR}+\frac{TOI}{k2*TOR}+\frac{BII}{k3*BIR}+\frac{BOI}{k4*BOR}\right)+1\right),$$

wherein TII is "Top Inner Current," BII is "Bottom Inner Current," TOI is "Top Outer Current," BOI is "Bottom Outer Current," TIR is "Top Inner Resistance," BIR is "Bottom Inner Resistance," TOR is "Top Outer Resistance," BOR is "Bottom Outer Resistance," and the expression "log" in equations is natural logarithm, and where factors k1, k2, k3, k4 are constants extracted from the data;

providing a lamp failure prediction for the lamp module using the virtual sensors as inputs; and performing maintenance on the lamp module based on the lamp failure prediction to increase uptime and reduce unscheduled downtime.

2. The method of claim 1, wherein the upper lamp is disposed relatively above an upper quartz window of the process chamber and the lower lamp is disposed relatively below a lower quartz portion of the process chamber.

3. A method, comprising:

collecting data of a lamp module disposed in a semiconductor process chamber from one or more physical sensors disposed at different locations within the lamp module;

creating virtual sensors based on the data of the lamp module, wherein the virtual sensors are represented as equations selected from one or more of the following:

$$\text{first virtual sensor} = \log\left(\text{abs}\left(\frac{TII}{k1*TIR}\right)+1\right),$$

$$\text{second virtual sensor} = \log\left(\text{abs}\left(\frac{TOI}{k2*TOR}\right)+1\right),$$

$$\text{third virtual sensor} = \log\left(\text{abs}\left(\frac{BII}{k3*BIR}\right)+1\right),$$

$$\text{fourth virtual sensor} = \log\left(\text{abs}\left(\frac{BOI}{k4*BOR}\right)+1\right), \text{ and}$$

$$\text{fifth virtual sensor} =$$

$$\log\left(\text{abs}\left(\frac{TII}{k1*TIR}+\frac{TOI}{k2*TOR}+\frac{BII}{k3*BIR}+\frac{BOI}{k4*BOR}\right)+1\right),$$

wherein TII is "Top Inner Current," BII is "Bottom Inner Current," TOI is "Top Outer Current," BOI is "Bottom Outer Current," TIR is "Top Inner Resistance," BIR is "Bottom Inner Resistance," TOR is "Top Outer Resistance," BOR is "Bottom Outer Resistance," and the expression "log" in equations is natural logarithm, and where factors k1, k2, k3, k4 are constants extracted from the data;

providing a prediction model for the lamp module using the virtual sensors as inputs; and performing maintenance on the lamp module based on the prediction model to increase uptime and reduce unscheduled downtime.

4. The method of claim 3, wherein the data comprises current and resistance related to an upper lamp module and/or a lower lamp module.

5. The method of claim 3, wherein the data comprises a current drawn at a given resistance of the lamp module.

6. The method of claim 3, wherein monitoring data of the lamp module uses one or more of selected features associated with the one or more physical sensors.

7. The method of claim 6, wherein the selected features comprises top inner current, bottom inner current, top outer current, bottom outer current, top inner resistance, bottom inner resistance, top outer resistance, and bottom outer resistance.

8. The method of claim 3, wherein the lamp module comprises an upper lamp module disposed relatively above an upper quartz window of the process chamber and/or a lower lamp module disposed relatively below a lower quartz portion of the process chamber.

9. The method of claim 8, wherein the lamp module comprises a number of lamps in multiples of four.

\* \* \* \* \*